(12) United States Patent
Wang

(10) Patent No.: US 7,969,786 B2
(45) Date of Patent: Jun. 28, 2011

(54) METHOD OF PROGRAMMING NONVOLATILE MEMORY DEVICE

(75) Inventor: Jong Hyun Wang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 166 days.

(21) Appl. No.: 12/361,231

(22) Filed: Jan. 28, 2009

(65) Prior Publication Data
US 2010/0008145 A1    Jan. 14, 2010

(30) Foreign Application Priority Data
Jul. 10, 2008    (KR) .................... 10-2008-0066876

(51) Int. Cl.
*G11C 16/04*    (2006.01)
(52) U.S. Cl. ............ 365/185.19; 365/185.2; 365/185.33
(58) Field of Classification Search ............. 365/185.19, 365/185.2, 185.22
See application file for complete search history.

(56) References Cited

U.S. PATENT DOCUMENTS

| | | | |
|---|---|---|---|
| 6,385,112 B1* | 5/2002 | Kurosaki | 365/185.33 |
| 7,558,115 B2* | 7/2009 | Joo | 365/185.18 |
| 7,630,251 B2* | 12/2009 | Hosono | 365/185.2 |

FOREIGN PATENT DOCUMENTS

KR    1020070039720 A    4/2007

OTHER PUBLICATIONS

Notice of Preliminary Rejection issued from Korean Intellectual Property Office on Jan. 27, 2010.

* cited by examiner

*Primary Examiner* — Pho M Luu
(74) *Attorney, Agent, or Firm* — IP & T Group LLP

(57) ABSTRACT

A method of programming nonvolatile memory devices. A program operation is performed by applying a dummy program pulse having a pulse width wider than a pulse width of a program start pulse. A program operation is performed by applying the program start pulse. It is then verified whether a program has been completed as a result of the program operation. A program operation is performed by applying a step-shaped dummy program pulse, which has a second pulse width and has been increased by a second step voltage. A program operation is performed by applying a program pulse having a first step voltage and a first pulse width. It is then verified whether a program has been completed as a result of the program operation.

15 Claims, 6 Drawing Sheets though not shown in the figure, after one program pulse is applied, a verify operation for checking whether a program has been completed according to the corresponding pulse application is performed.

METHOD OF PROGRAMMING NONVOLATILE MEMORY DEVICE

CROSS-REFERENCE TO RELATED APPLICATION

The present application claims priority to Korean patent application number 10-2008-0066876, filed on Jul. 10, 2008, which is incorporated by reference in its entirety.

BACKGROUND OF THE INVENTION

The present invention relates to a method of programming nonvolatile memory devices.

In recent years, there is an increasing demand for nonvolatile memory devices that can be electrically programmed and erased and do not need the refresh function of rewriting data at specific intervals.

The nonvolatile memory cell is an element enabling electrical program/erase operations and is configured to perform the program and erase operations by changing its threshold voltage as electrons migrate by a strong electric field applied to a thin oxide layer of 100 angstrom or less.

The nonvolatile memory device generally includes a memory cell array in which cells for storing data are arranged in matrix form, and a page buffer for writing data into specific cells of the memory cell array or reading data stored in specific cells. The page buffer includes a bit line pair connected to a specific memory cell, a register for temporarily storing data to be written into a memory cell array, or reading data of a specific cell from the memory cell array and temporarily storing the read data therein, a sensing node for sensing the voltage level of a specific bit line or a specific register, and a bit line selection unit for controlling whether or not to connect a specific bit line to the sensing node.

As a program method of this nonvolatile memory device, an incremental step pulse programming (ISPP) method has been known. That is, a program operation is performed by constantly increasing a program start voltage by a step voltage. However, as the number of program and erase operations increases, the program speed of a memory cell increases. Further, even though a low program start pulse is applied, a change in the threshold voltage of a memory cell increases. In order to prevent this abrupt change, a method of applying dummy program pulses before the application of the program start pulse has been known. However, this method is problematic in that the entire program time is increased.

BRIEF SUMMARY OF THE INVENTION

The present invention is directed toward a method of programming a nonvolatile memory device, which can shorten the program time while applying dummy program pulses.

A method of programming a nonvolatile memory device according to an aspect of the invention includes performing a program operation by applying a dummy program pulse having a pulse width wider than a pulse width of a program start pulse, performing a program operation by applying the program start pulse, and verifying whether a program has been completed as a result of the program operation.

A method of programming a nonvolatile memory device according to another aspect of the invention includes performing a program operation by applying a step-shaped dummy program pulse, which has a second pulse width and has been increased by a second step voltage, performing a program operation by applying a program pulse having a first step voltage and a first pulse width, and verifying whether a program has been completed as a result of the program operation.

DESCRIPTION OF SPECIFIC EMBODIMENTS

Now, specific embodiments according to the present invention will be described with reference to the accompanying drawings. However, the invention is not limited to the disclosed embodiments, but may be implemented in various ways. The embodiments are provided to complete the disclosure of the invention and to allow those having ordinary skill in the art to understand the scope of the invention. The invention is defined by the claims.

Figure 1:
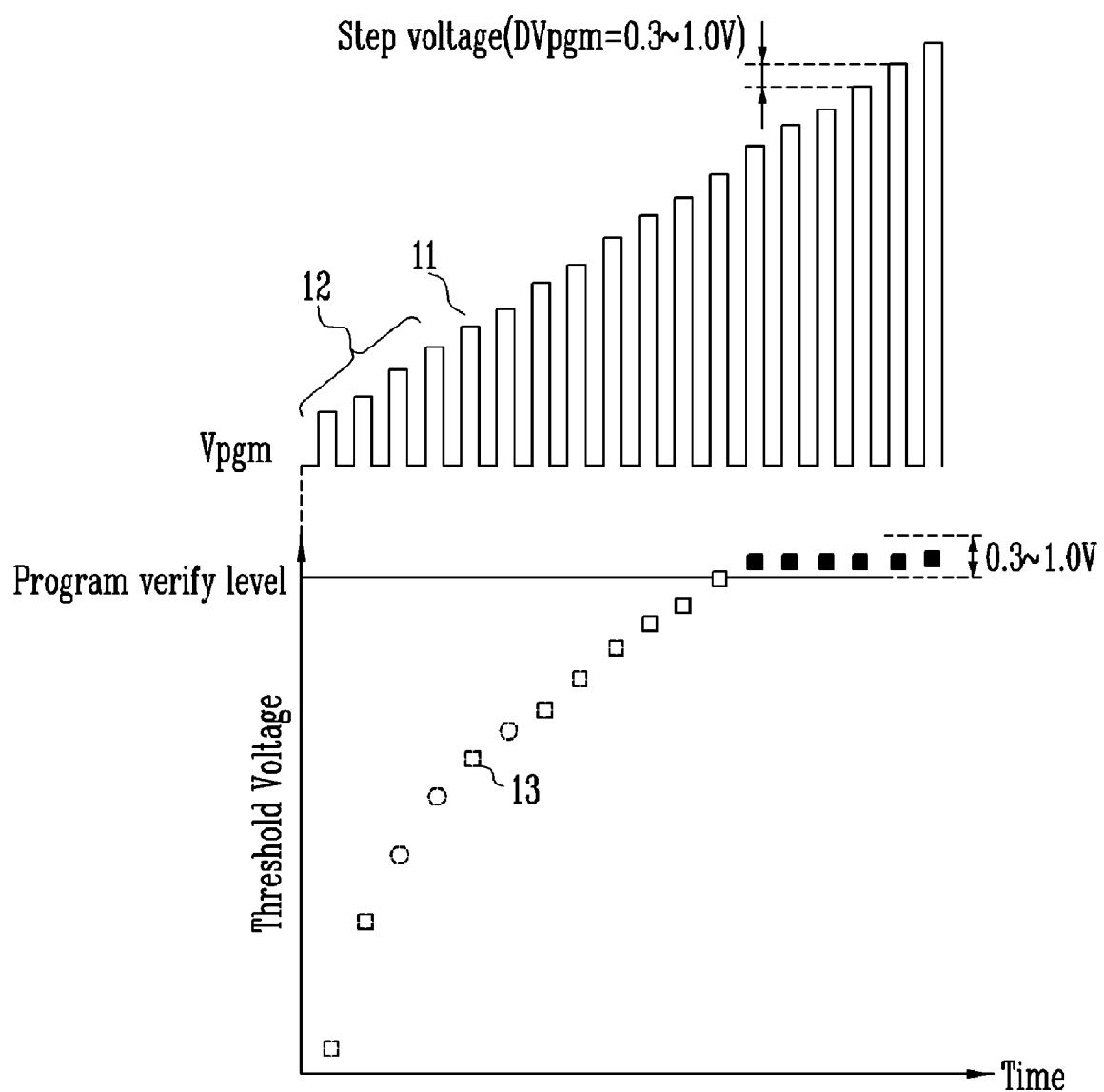
FIG. 1 is a diagram showing a typical method of applying dummy program pulses of a nonvolatile memory device.

FIG. 1 is a diagram showing a typical method of applying dummy program pulses of a nonvolatile memory device.

As a method of programming a nonvolatile memory device, the ISPP method has been known. The ISPP method is a method of performing a program by applying program pulses, which are increased by a step voltage on the basis of a program start voltage. After one program pulse is applied, a verify operation for checking whether a program according to the application of the corresponding pulse has been completed.

As shown in FIG. 1, program pulses, which are consistently increased by a step voltage DVpgm on the basis of a program start voltage 11, are applied. Although not shown in the drawing, after the program pulse is applied, a verify operation is performed.

Meanwhile, a method of applying dummy program pulses, which has been improved from this ISPP method, has been known. In the case in which program/erase operations are repeatedly performed on a nonvolatile memory device, there is a tendency that the program speed becomes fast due to the characteristic of a memory cell. As the program/erase numbers of the nonvolatile memory device increases, a change in the threshold voltage, which is accompanied by application of a first pulse at the time of ISPP, is increased. Accordingly, by considering a change in the program speed, which is caused by the increase of the program/erase numbers as described above, a program operation is performed by applying a program pulse having a voltage level lower than that of the conventional program start voltage 11. Here, the program pulse is defined as a dummy program pulse 12.

The dummy program pulse 12 is applied for the first time and has a voltage level, which is 3 to 4 step lower than the first program start pulse 11. A plurality of the dummy program pulses is applied by increasing them by a step voltage. Meanwhile, when the dummy program pulses 12 are applied, an additional verify operation is not performed.

When the program/erase numbers are small, a change in the threshold voltage is not great although the dummy program pulses 12 are applied. However, when the program/erase numbers are great, a change in the threshold voltage is great. Meanwhile, in accordance with the above method, before the conventional program start voltage 11 is applied, the dummy program pulses 12 are applied, so the threshold voltage partially rises. Accordingly, an abrupt change in the threshold voltage can be prevented, and expansion of threshold voltage distributions due to the abrupt change in the threshold voltage can be prevented. However, this method of applying the dummy program pulses is problematic in that it increases the program time.

Figure 2:
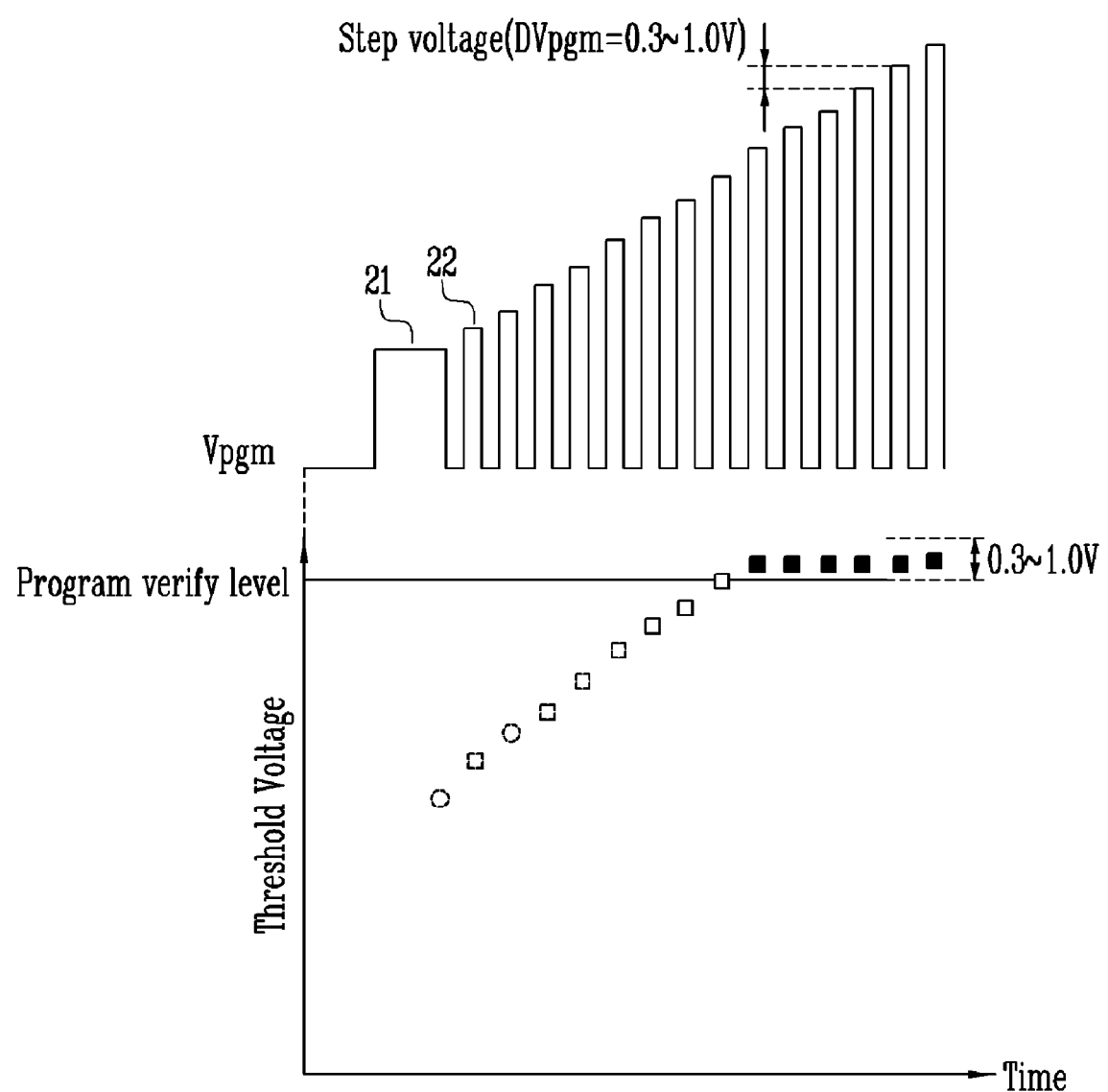
FIG. 2 is a diagram showing a method of applying dummy program pulses of a nonvolatile memory device in accordance with an embodiment of the present invention.

FIG. 2 is a diagram showing a method of applying dummy program pulses of a nonvolatile memory device in accordance with an embodiment of the present invention.

As shown in the drawing, a dummy program pulse 21, having a pulse width wider than that of a first program start pulse 22, is applied. The dummy program pulse can have a voltage level, which is one step voltage smaller than that of the first program start pulse 22. Here, the step voltage can range from 0.3 to 1.0V. Further, the dummy program pulse can have a pulse width, which is n times wider than a pulse width of the program start pulse. The dummy program pulse can have a pulse width, which is 3 or 4 times wider than a pulse width of the program start pulse, and have a voltage value, which is lower by a step voltage than the program start pulse.

In this case, the program time can be shortened since once pulse is applied without having a pause period as in FIG. 1 after the dummy program pulse is applied.

It is to be understood that the pulse width and the voltage value of the dummy program pulse can be controlled by those having ordinary skill in the art through a typical ISPP pulse controller (not shown) included in a nonvolatile memory device. Accordingly, a detailed construction of the ISPP pulse controller is omitted for simplicity.

Figure 3:
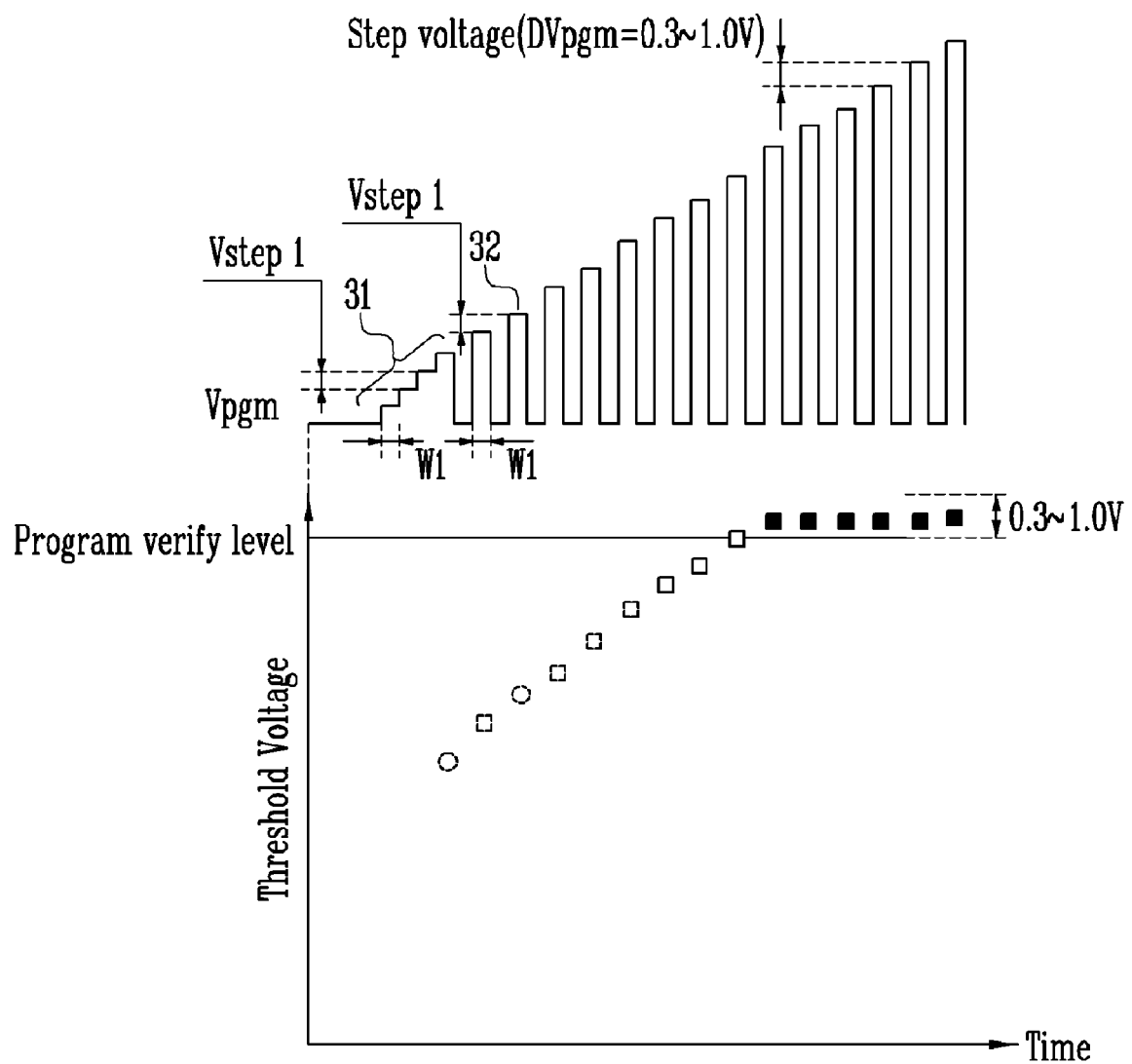
FIG. 3 is a diagram showing a method of applying dummy program pulses of a nonvolatile memory device in accordance with another embodiment of the invention.

FIG. 3 is a diagram showing a method of applying dummy program pulses of a nonvolatile memory device in accordance with another embodiment of the invention.

As shown in FIG. 3, a dummy program pulse 31 is applied before a first program start pulse 32 is applied, wherein a voltage level of the dummy program pulse rises stepwise. In other words, the method of FIG. 3 can correspond to a method of applying the dummy program pulses shown in FIG. 1 without the pause periods. This dummy program pulse 31 is called a step-shaped dummy program pulse.

Each of the dummy program pulses, constituting the step-shaped dummy program pulse, can have a pulse width that is identical to or different from that of the first program start pulse 32. Further, a voltage difference between the dummy program pulses can be identical to or different from a step voltage between program pulses applied after the first program start pulse 32 is applied. It is to be understood that this can be controlled using the ISPP pulse controller.

In accordance with an embodiment of the invention, each of the dummy program pulses, constituting the step-shaped dummy program pulse 31, can have the same pulse width (W1) as that of the program start pulse. Further, a voltage difference between the dummy program pulses can be identical to a step voltage (Vstep1) between the program pulses.

As shown in FIG. 3, the dummy program pulses each of which has the same pulse width as the pulse width (W1) of the program start pulse 32 before the program start pulse is applied and has the same step voltage as the step voltage (Vstep1) when the program pulses are applied, can be applied.

That is, the dummy program pulses, constituting the step-shaped dummy program pulse 31, can include a first pulse, which is n-times the step voltage lower than the program start pulse, a second pulse, which is (n−1)-times the step voltage lower than the program start pulse, ..., a (n−1) pulse, which is twice step voltage lower than the program start pulse, and an $n^{th}$ pulse, which is lower by the step voltage than the program start pulse. Each of the dummy program pulses can have the same pulse width as that of the program start pulse.

In other words, the step-shaped dummy program pulse can include a first pulse, which is n-times the step voltage lower than the program start pulse, and second to $n^{th}$ pulses (n being an integer greater than two), which are one to (n−1)-times the step voltage greater than the first pulse. Each of the dummy program pulses constituting the step-shaped dummy program pulse can have the same pulse width as that of the program start pulse.

Meanwhile, the step-shaped dummy program pulse can be formed into various forms of dummy program pulses by controlling a pulse width of each pulse and a voltage difference between the respective pulses.

FIGS. 4A to 4E are diagrams showing a method of applying dummy program pulses of a nonvolatile memory device in accordance with still another embodiment of the invention.

Figure 4A:
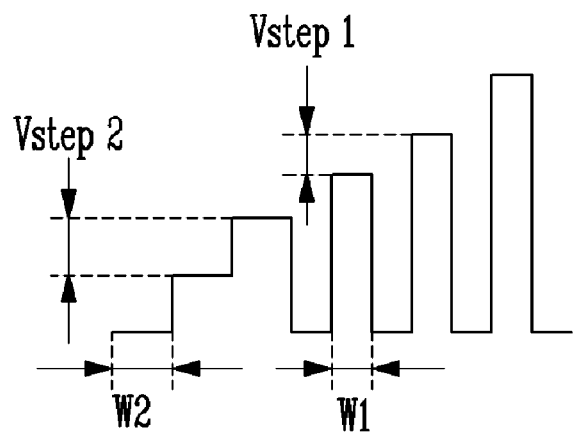
FIGS. 4A to 4E are diagrams showing a method of applying dummy program pulses of a nonvolatile memory device in accordance with still another embodiment of the invention.

First, FIG. 4A shows an example in which a pulse width (W2) of each dummy program pulse is larger than the pulse width (W1) of the program start pulse and a voltage difference (Vstep2) between the dummy program pulses is larger than the step voltage (Vstep1) of the program pulse.

Figure 4B:
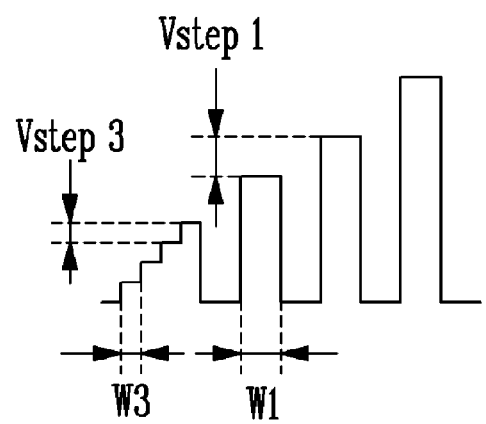

FIG. 4B shows an example in which a pulse width (W3) of each dummy program pulse is smaller than the pulse width (W1) of the program start pulse and a voltage difference (Vstep3) between the dummy program pulses is smaller than the step voltage (Vstep1) of the program pulse.

Figure 4C:
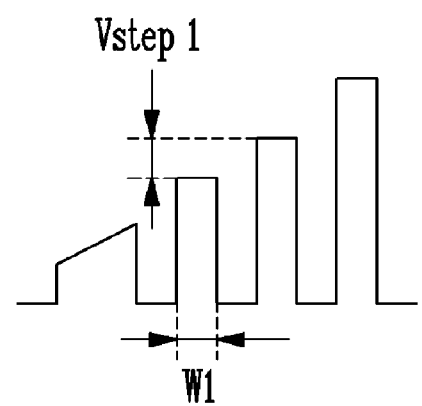

Here, if the pulse width (W3) and the voltage difference (Vstep3) are minimized, dummy program pulses, which are increased linearly as shown in FIG. 4C, can be formed.

Figure 4D:
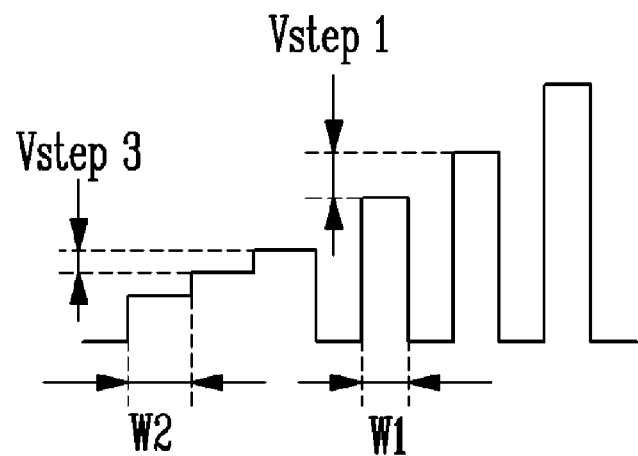

FIG. 4D shows an example in which a pulse width (W2) of each dummy program pulse is larger than the pulse width (W1) of the program start pulse, but a voltage difference (Vstep3) between the dummy program pulses is smaller than the step voltage (Vstep1) of the program pulse.

Figure 4E:
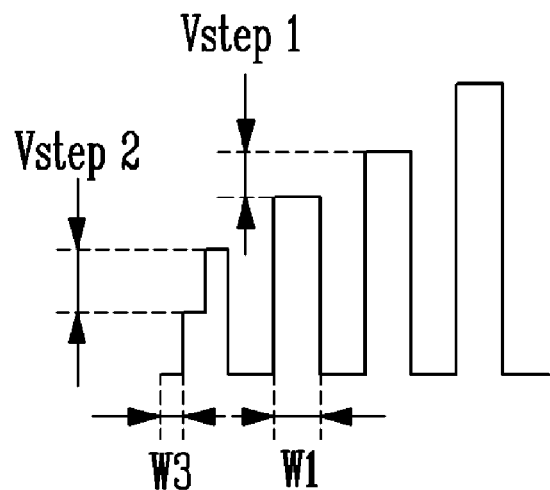

FIG. 4E shows an example in which a pulse width (W3) of each dummy program pulse is smaller than the pulse width (W1) of the program start pulse, but a voltage difference (Vstep2) between the dummy program pulses is larger than the step voltage (Vstep1) of the program pulse.

As described above, various forms of dummy program pulses can be formed by differently controlling the pulse width of each dummy program pulse and the voltage difference between the dummy program pulses.

Figure 5:
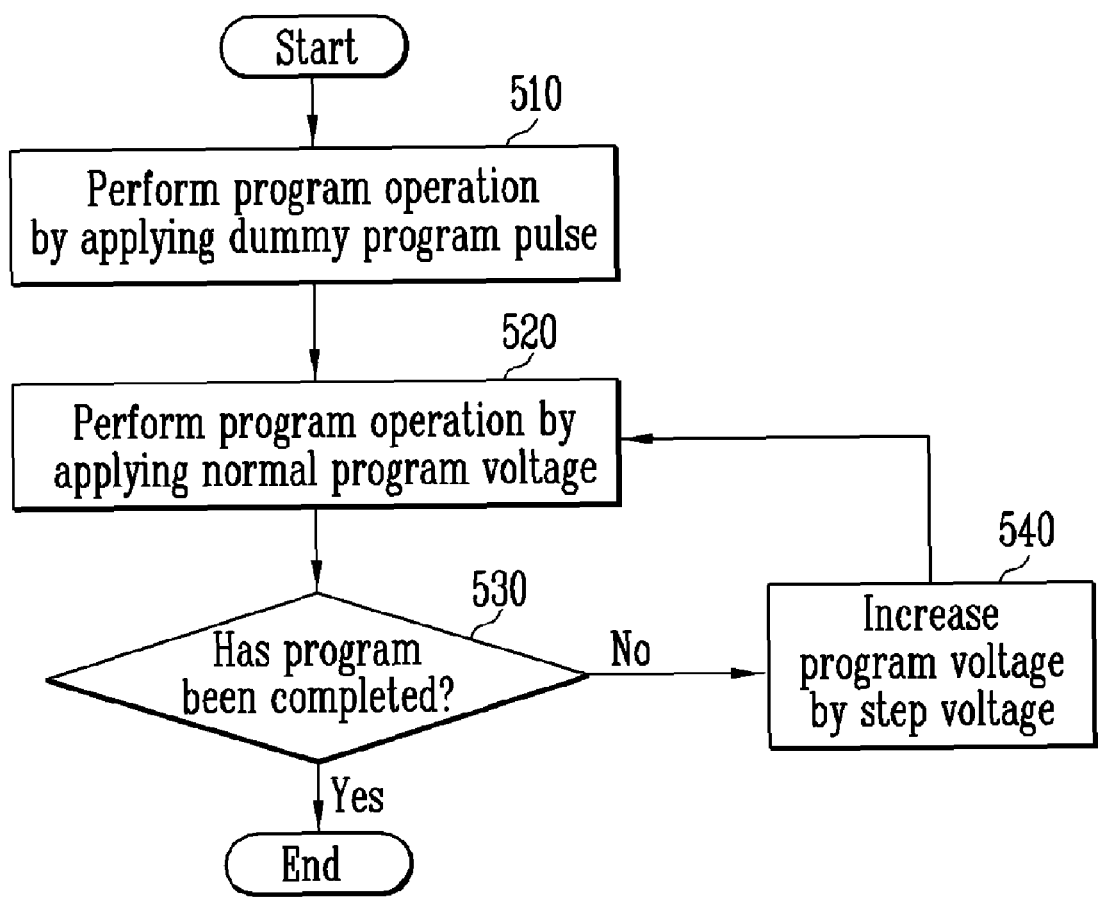
FIG. 5 is a flowchart illustrating a program method of a nonvolatile memory device according to the present invention.

FIG. 5 is a flowchart illustrating a method of programming a nonvolatile memory device according to the invention. First, a dummy program pulse is applied in order to perform a program operation in step 510. The dummy program pulse can have a form as shown in FIG. 2, 3 or 4. After the dummy program pulse is applied, an additional verify operation is not performed. The same program operation as a typical program operation is performed except that the dummy program pulse is applied to a selected word line.

Next, a normal program voltage is applied so as to perform a program operation in step 520. A program start pulse is applied immediately after the dummy program pulse is applied. The program start pulse is a first program pulse accompanied by a verify operation. Thereafter, the program operation can be performed by increasing the program start pulse by n-times the step voltage according to whether the verify operation has been completed. Here, the applied program pulse is called a normal program voltage.

After the normal program voltage is applied, the verify operation is performed in order to check whether the program has been completed in step 530. That is, when externally input data is all programmed into a designated memory cell, the program operation is finished without additional measures.

However, when there is a cell that has not been programmed, the program voltage is increased by the step voltage in step 540. The program operation (step 520) is then performed repeatedly by applying the program pulse, which has been increased by the step voltage.

As described above, before a normal program is performed, dummy program pulses are applied, but applied as one pulse with pause periods between the dummy program pulses being omitted. Accordingly, the entire program time can be shortened.

According to the configuration of the invention, pause periods between dummy program pulses can be minimized in a period in which the dummy program pulses are applied and, therefore, the time taken for the entire program operation can be shortened. Further, since the dummy program pulses are applied, an abrupt change in the threshold voltage at the time of a program operation, which is caused by increased program/erase numbers, can be prevented.

The embodiments disclosed herein have been proposed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A method of programming nonvolatile memory device, comprising:
performing a program operation by applying a dummy program pulse having a pulse width wider than a pulse width of a program start pulse;
performing a program operation by applying the program start pulse; and
verifying whether a program has been completed as a result of the program operation.

2. The programming method of claim 1, wherein the dummy program pulse has a pulse width, which is 'n' times wider than the pulse width of the program start pulse, 'n' being a positive integer.

3. The programming method of claim 2, wherein the dummy program pulse has a voltage value, which is lower by a step voltage than that of the program start pulse.

4. The programming method of claim 2, wherein the 'n' is 3 or 4.

5. The programming method of claim 1, further comprising, if as a result of the verification, a determination is made that the program has not been completed, performing the program operation again by increasing the program pulse applied in a just-before program operation by a step voltage.

6. The programming method of claim 5, further comprising performing the program operation again until the program is completed according to the verification result, and repeatedly performing the verification.

7. The program method of claim 1, further comprising, if, as a result of the verification, a determination is made that the program has been completed, finishing the program operation.

8. A method of a programming nonvolatile memory device, comprising:
performing a program operation by applying a step-shaped dummy program pulse rising stepwise without pause periods;
performing a program operation by applying a program pulse having a first step voltage and a first pulse width; and
verifying whether a program has been completed as a result of the program operation.

9. The programming method of claim 8, wherein the step-shaped dummy program pulse has steps with a second pulse width and a second step voltage.

10. The programming method of claim 9, wherein the second step voltage of the step-shaped dummy program pulse is identical to the first step voltage of the program pulse.

11. The programming method of claim 9, wherein the second pulse width of the step-shaped dummy program pulse is identical to the first pulse width of the program pulse.

12. The programming method of claim 9, wherein the step-shaped dummy program pulse includes a first pulse, which is n-times the step voltage lower than the program start pulse, and second to $n^{th}$ pulses, which are one to (n−1)-times the step voltage greater than the first pulse, n being a positive integer, and the second pulse width of each of the dummy program pulses is identical to the first pulse width.

13. The programming method of claim 9, further comprising, if, as a result of the verification, a determination is made that the program has not been completed, performing the program operation again by increasing a program pulse applied in a just-before program operation by the step voltage.

14. The programming method of claim 13, further comprising performing the program operation again until the program is completed according to the verification result, and repeatedly performing the verification.

15. The programming method of claim 9, further comprising, if, as a result of the verification, a determination is made that the program has been completed, finishing the program operation.

* * * * *